United States Patent
Kosonocky et al.

(10) Patent No.: US 9,194,914 B2
(45) Date of Patent: Nov. 24, 2015

(54) POWER SUPPLY MONITOR FOR DETECTING FAULTS DURING SCAN TESTING

(71) Applicant: Advanced Micro Devices, Inc., Sunnyvale, CA (US)

(72) Inventors: Stephen V. Kosonocky, Fort Collins, CO (US); Grady Giles, Dripping Springs, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 57 days.

(21) Appl. No.: 13/943,405

(22) Filed: Jul. 16, 2013

(65) Prior Publication Data
US 2015/0026531 A1 Jan. 22, 2015

(51) Int. Cl.
*G01R 31/28* (2006.01)
*G01R 31/3185* (2006.01)

(52) U.S. Cl.
CPC *G01R 31/318575* (2013.01); *G01R 31/318547* (2013.01)

(58) Field of Classification Search
CPC ............ H03K 19/00369; H01L 23/34; G01R 31/318508; G01R 31/318572; G01R 31/315; G01R 31/2853; G01R 31/318533; G01R 31/318575; G01R 31/318536; G01R 31/40; G01R 31/405; G01R 31/42; G01R 19/16538; H02S 50/10; G06F 17/5081
See application file for complete search history.

(56) References Cited

U.S. PATENT DOCUMENTS

| | | | | |
|---|---|---|---|---|
| 4,037,156 | A * | 7/1977 | Goujon et al. | 324/764.01 |
| 5,498,972 | A * | 3/1996 | Haulin | 324/754.03 |
| 5,710,701 | A * | 1/1998 | Brown | 700/80 |
| 7,610,531 | B2 * | 10/2009 | Dhong et al. | 714/724 |
| 8,277,120 | B2 * | 10/2012 | Ishii | 374/179 |
| 8,413,102 | B2 * | 4/2013 | Yang | 716/136 |
| 2007/0211285 | A1 * | 9/2007 | Shipton | 358/1.15 |
| 2008/0082887 | A1 * | 4/2008 | Dhong et al. | 714/738 |
| 2010/0253416 | A1 * | 10/2010 | Ishii | 327/513 |
| 2010/0315749 | A1 * | 12/2010 | Xie et al. | 361/91.1 |
| 2012/0126847 | A1 | 5/2012 | Kosonocky et al. | |
| 2013/0036394 | A1 * | 2/2013 | Yang | 716/112 |
| 2013/0054043 | A1 * | 2/2013 | Klodowski et al. | 700/293 |
| 2013/0088894 | A1 * | 4/2013 | Rozman et al. | 363/15 |
| 2013/0229189 | A1 * | 9/2013 | Pang et al. | 324/509 |

OTHER PUBLICATIONS

Rex Petersen et al., "Voltage Transient Detection and Induction for Debug and Test", International Test Conference, Nov. 1, 2009, 10 pages.
U.S. Appl. No. 13/687,837, filed Nov. 28, 2012, entitled "Test Circuit Having Scan Warm-up".

* cited by examiner

*Primary Examiner* — Guerrier Merant

(57) ABSTRACT

Some embodiments of a power supply monitor include a measurement circuit to measure a voltage provided to the power supply monitor, a comparator to compare the voltage to a predetermined voltage threshold, and an interface to provide, during a scan test of a processing device including the power supply monitor, a fault signal in response to the voltage being below the voltage threshold. Some embodiments of a method include providing a first test pattern to one or more power supply monitors associated with one or more circuit blocks in the processing device and capturing a first result generated by the power supply monitor(s) based on the first test pattern. The first result indicates whether a voltage provided to the circuit block(s) is below a voltage threshold.

20 Claims, 12 Drawing Sheets

POWER SUPPLY MONITOR FOR DETECTING FAULTS DURING SCAN TESTING

FIELD OF THE DISCLOSURE

This application relates generally to processing systems, and, more particularly, to power supply monitors for detecting faults during scan testing of a processing system.

BACKGROUND

A wafer level scan is a test method used to discover timing faults in digital logic at the wafer probe level. Scan testing can be used to test the timing of critical path circuits in processing devices such as data processors, very large scale integrated circuits (VLSI), systems on chips (SoCs), central processing units (CPUs), advanced processing units (APUs), graphics processing units (GPUs), memory sub-systems, and system controllers. For example, Automatic Test Pattern Generation (ATPG) may be used to determine if a processing device is operating according to specification. More advanced "at speed" ATPG technologies launch test patterns and capture the resulting data in a manner that tests a functional circuit at substantially the same speed that the functional circuit is intended to operate during normal operation.

During a typical scan test, shift registers are used to shift state information into registers (e.g., a scan chain). The values stored in the registers define the state of corresponding circuit blocks of the processing device under test. The state information may be referred to as a test vector, a test pattern, a scan vector, or a scan pattern. For each test vector, a first capture clock pulse is applied, which initiates propagation of signals through the circuit blocks of the processing device. A second capture clock pulse is applied after a predetermined time interval to capture the results of the logic gate transitions that occur following the first capture clock pulse. The predetermined time interval may be referred to as a cycle time and typically has a value that corresponds to the shortest period or highest frequency of operation of the processing device, i.e., the test is performed "at speed." The captured results may then be used to determine whether the processing device is functioning correctly or whether one or more scan faults indicate deficiencies in the design or fabrication of the processing device.

A scan set includes a collection of test vectors {V} that are used to verify the fault universe of the processing device. The fault universe may be defined as a collection of all the inputs and outputs of the processing device that are slow-to-rise (e.g., require more than a cycle time to change from a low state to a high state) or are slow to fall (e.g., require more than a cycle time to change from a high state to a low state) when tested at various operating frequencies and voltage pairs. The number of test vectors depends on the total number of testable nodes in the processing device and can range from tens of thousands to hundreds of thousands of vectors per scan set. Testing schemes typically attempt to minimize the total number of test vectors in the scan set to minimize total test time and cost.

DETAILED DESCRIPTION

Figure 1:
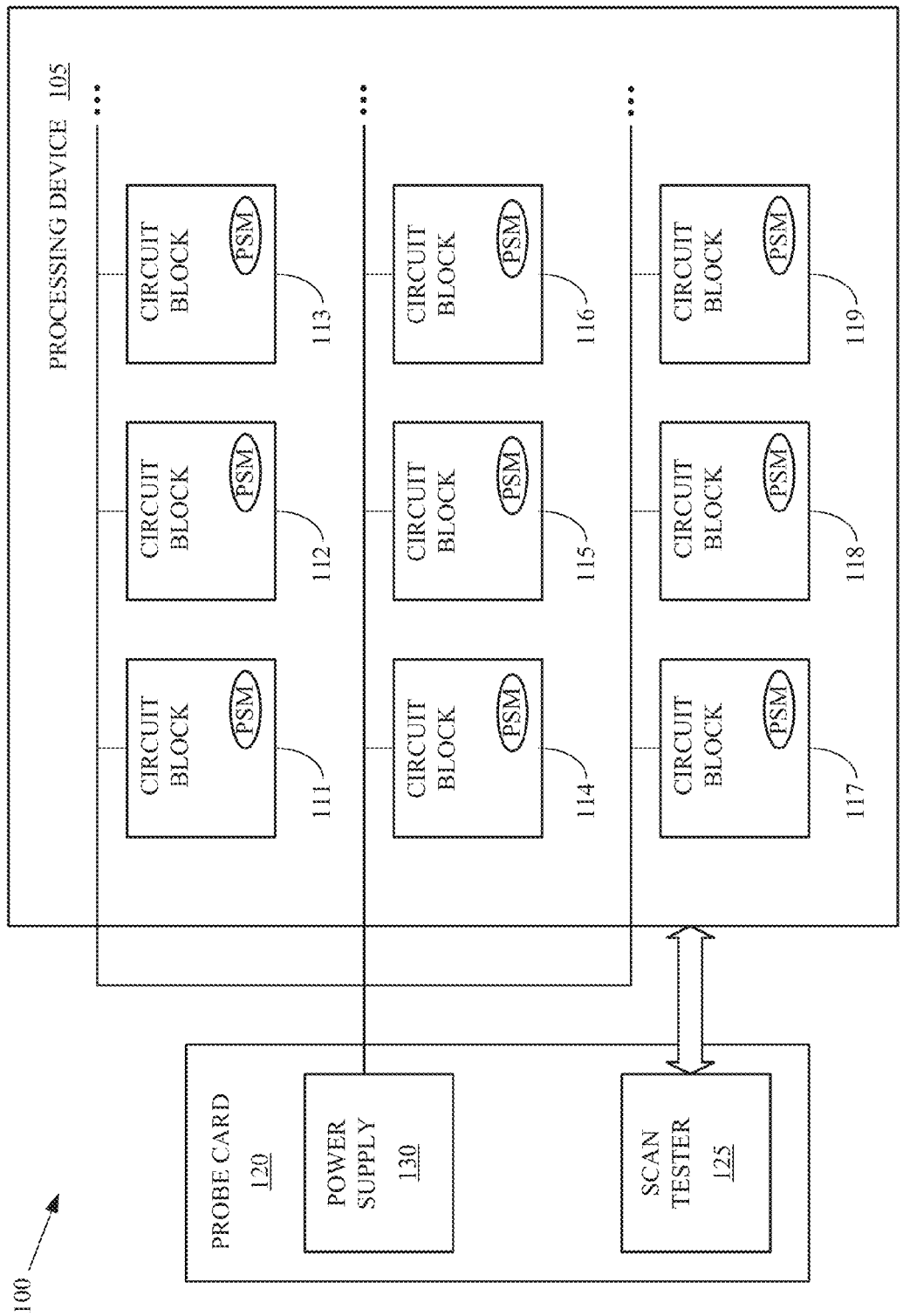
FIG. 1 is a block diagram of a system for performing scan testing of a processing device, according to some embodiments.

Power delivered to critical path circuits during a conventional scan test of a processing device can collapse while the state of the machine advances from an initial state to the next state, at least in part because large portions of the processing device may stop performing operations and the current supplied to the processing device by a power supply may drop. The power delivered to the critical path circuits may then jump following the first capture clock pulse because of large current transients that arise when signals begin to propagate through the processing device. The large current transients may cause the voltage supplied by the power supply to decrease. The decrease in the voltage is conventionally referred to as "voltage droop." The voltage droop caused by the scan test current transients can slow down the circuit blocks and produce false positive errors in the scan test, e.g., error conditions that are the result of the voltage droop and not the result of deficiencies in the design or fabrication of the processing device. For example, a large voltage droop during the scan test can skew the frequency response results of the test and cause path delays to increase, which may result in miscorrelations to actual path failures during a normal functional mode of the processing device.

In addition to the transient current draw, wafer testing may use a probe card that can have a much more inductive power supply distribution than a typical product system, which may cause even larger voltage droops than typically seen in a functioning system and may consequently result in more false positive errors. For example, the transient current draw may induce a larger voltage droop due to the reactance of the power supply distribution in the probe card. Large numbers of false positive errors can mask functional errors and reduce the correlation between the scan test results and the functional errors. Consequently, the processing device may need further testing, e.g., time consuming and costly functional pattern tests may need to be performed on packaged parts in order to differentiate non-functional and functional parts.

At least in part to address the aforementioned problems in the conventional scan testing techniques, FIGS. 1-10 illustrate some embodiments of power supply monitoring systems that can detect scan testing faults that are caused by variations in the voltage applied to a processing device by a power supply. Some embodiments of the processing device include one or more power supply monitors that can measure the voltage at different locations in the processing device following a first capture clock pulse generated by scan testing logic. Some embodiments of the power supply monitors may use a ring oscillator to generate a digital output that corresponds to the voltage applied to the power supply monitor. The power supply monitors can then produce a fault signal (or signals) if some or all of the measured voltages are below a threshold value, which may correspond to a voltage level that would lead to a false-positive error for a scan test. The power supply monitors may also include a scan chain input that can be used to configure the power supply monitor to measure the applied voltage in response to the first capture clock pulse or a subsequent capture clock pulse. The fault signal(s) can be then correlated with scan test results to identify scan faults that may have been caused by the voltage droop. Such scan faults can be retested using a modified scan set of test vectors that produce smaller voltage droops, thereby reducing the likelihood that a functional device is misidentified as non-functional due to false positive errors caused by the voltage droop.

FIG. 1 is a block diagram of a system 100 for performing scan testing of a processing device 105, according to some embodiments. The processing device 105 may be a data processor, a very large scale integrated circuit (VLSI), a system on a chip (SoC), a central processing unit (CPU), an accelerated processing unit (APU), a graphics processing unit (GPU), a memory sub-system, a system controller, a peripheral function, or some other type of processing device. The processing device 105 shown in FIG. 1 includes a plurality of circuit blocks 111-119, which may be used to implement portions of the functionality of the processing device 105. The circuit blocks 111-119 may therefore be interconnected and communicate with each other, e.g., by transmitting or receiving signals over various lines, traces, buses, vias, through-silicon vias, and the like. In the interest of clarity, interconnections between the circuit blocks 111-119 are not shown in FIG. 1.

Each circuit block 111-119 is also associated with a power supply monitor (PSM). Exemplary PSMs are described in U.S. Patent Application Publication No. 2012/0126847, entitled Power Supply Monitor, by Stephen V. Kosonocky and Gregory K. Chen, which is incorporated herein by reference in its entirety. The PSMs may be incorporated in the circuit blocks 111-119 as shown in FIG. 1 or they may be implemented as separate devices that are coupled to the circuit blocks 111-119. However, persons of ordinary skill in the art having benefit of the present disclosure should appreciate that some embodiments of the processing device 105 may include circuit blocks 111-119 that are associated with more than one PSM. Moreover, some PSMs may be associated with more than one circuit block 111-119. As discussed herein, the voltages in the circuit blocks 111-119 may not be equal to the voltage generated by the power supply 130, e.g. due to voltage droop. Each PSM may therefore measure voltages at the location of the PSM and the measured voltages may be indicative of the voltage that is applied to the corresponding circuit block 111-119. For example, the voltage measured by the PSM in the circuit block 111 may be substantially equal to the voltage generated at the circuit block 111 by the power supply 130. The PSMs may also be able to compare the measured voltage to a predetermined voltage threshold and generate a fault signal in response to the measured voltage being below the voltage threshold.

The processing device 105 may be tested by coupling the processing device 105 to a testing circuit such as the testing circuit on probe card 120. Some embodiments of the testing circuit include a scan tester 125 that can be used to provide test vectors to configure the circuit blocks 111-119 and PSMs for testing. For example, the scan tester 125 may provide test vectors to scan chains (not shown) in the circuit blocks 111-119 using a common boundary scan test interface that conforms to the Institute of Electrical and Electronic Engineers ("IEEE") standard 1149.1, which may also be referred to as the Joint Test Action Group (JTAG) standard test access port and boundary scan architecture. Some embodiments of the scan tester 125 may perform "at-speed" testing of the processing device 105 by initiating a test of the processing device 105 after scanning a test vector into the scan chains and capturing the test results in a manner that tests a functional circuit at substantially the same speed that the functional circuit runs during normal operation. For example, the scan tester 125 may initiate a test by providing a clock capture pulse to the processing device 105 and then capture the results by providing another clock capture pulse after a cycle time corresponding to a maximum clock frequency (or minimum period) of the processing device 105. Nodes in the processing device 105 may generate a fault if they are slow-to-rise (e.g., require more than the cycle time to change from a low state to a high state) or are slow to fall (e.g., require more than the cycle time to change from a high state to a low state).

The probe card 120 also includes a power supply 130 for providing power to the circuit blocks 111-119 at a nominal voltage. For example, the power supply 130 may provide power to the circuit blocks 111-119 during testing performed by the scan tester 125. The circuit blocks 111-119 may then draw a relatively large amount of current when the scan tester 125 initiates the test and signals begin to propagate through the circuit blocks 111-119. These large current transients may cause a significant voltage droop that may cause a fault condition during a test of the circuit blocks 111-119, even if the circuit blocks 111-119 are operating correctly. The PSMs may therefore measure the voltage supplied to the circuit blocks 111-119 during the testing interval. For example, scan tester 125 may provide a test vector to configure the PSMs so that they measure the voltage after the scan tester 125 provides a capture clock pulse to initiate testing of the processing device 105. The PSMs may return a fault signal if the measured voltage droops below a voltage threshold.

The scan tester 125 may read out the fault signal from the scan chain, e.g., in response to another capture clock pulse. Some embodiments of the scan tester 125 may use the fault signals generated by the PSMs to decide whether to accept a test result or modify the scan set and retest the processing device 105. For example, the scan tester 125 may scan in each of the test vectors in the scan set and read out fault signals generated by the PSMs following each test. The PSM fault signals may then be compared a target PSM alarm level that corresponds to a target voltage variance. Test vectors that produce PSM fault signals that exceed the target PSM alarm level may be removed from the scan set. The fault coverage of the scan set may also be evaluated. If the fault coverage is satisfactory, the scan tester 125 may accept the results. Otherwise, the scan tester 125 may generate a new scan set for the undetected faults. The scan tester 125 may repeat this process until the fault coverage meets a predetermined target value.

Figure 2A:
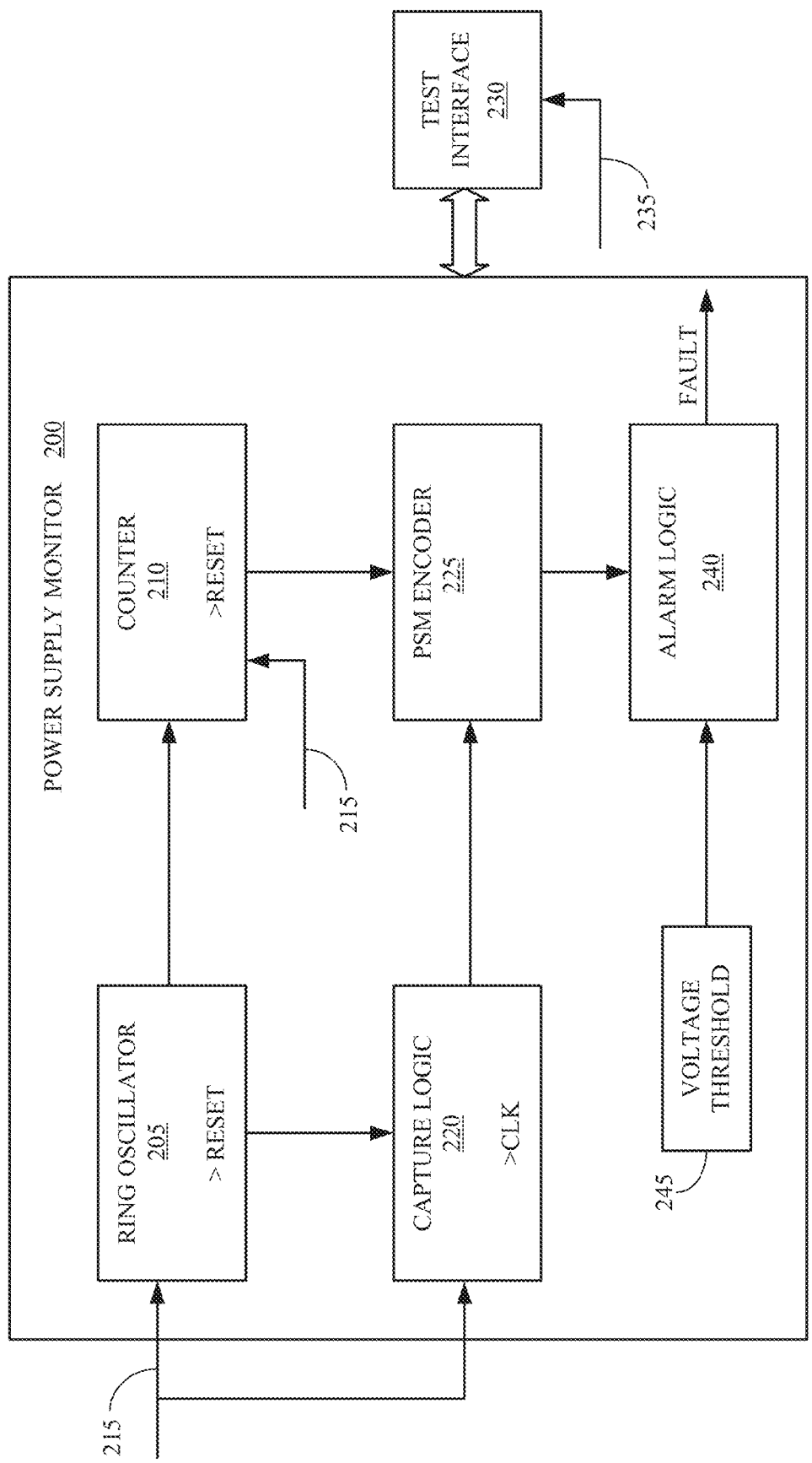
FIG. 2A is a block diagram of a power supply monitor (PSM) that may be used in the processing device shown in FIG. 1, according to some embodiments.

FIG. 2A is a block diagram of a power supply monitor (PSM) 200 that may be used in the processing device 105 shown in FIG. 1, according to some embodiments. Some embodiments of the power supply monitor 200 include a ring oscillator 205 that may be formed of multiple stages and the number of stages used to form the ring oscillator 205 may determine, at least in part, the voltage resolution of the power supply monitor 200. Techniques for implementing and operating ring oscillators 205 are known in the art and in the interest of clarity only those aspects of implementing or operating the ring oscillator 205 that are relevant to the claimed subject matter are discussed herein.

A counter 210 in the power supply monitor 200 can count the number of stage transitions in the ring oscillator 205 during a selected measurement period such as a clock cycle, a combination of multiple clock cycles, or a fraction of a clock cycle. For example, voltage droops can slow the oscillator speed of the ring oscillator 205, resulting in fewer stage transitions in the multiple stages of the ring oscillator 205. Increases in the voltage may increase the oscillator speed of the ring oscillator 205 and therefore increase the number of stages traversed in a clock cycle. The multiple stages of the ring oscillator 205 are arranged in a ring and so the counter 210 may also count a number of revolutions of the ring oscillator 205 during the measurement period. The number of revolutions increases when the voltage increases and decreases during voltage droops. Some embodiments of the ring oscillator 205 or the counter 210 may be reset on a leading edge of a clock cycle provided by the clock signal 215. Capture logic 220 can capture the state of the ring oscillator at the end of the measurement period.

The number of stage transitions or ring oscillator revolutions may be indicative of the voltage at the power supply monitor 200. Information indicating the number of stage transitions or ring oscillator revolutions counted by the counter 210 (and consequently the voltage measured by the counter 210) during the selected measurement period can be provided to a PSM encoder 225 that supplies a PSM output signal based on the state of the ring oscillator 205 and the number of ring oscillator revolutions at the end of the measurement period. Some embodiments of the power supply monitor 200 may provide this information using a test interface 230. For example, the power supply monitor 200 may provide a signal indicating a number of stage transitions of the ring oscillator 205, which is indicative of the voltage measured by the power supply monitor 200, via a test interface 230 such as a scan chain that operates according to JTAG protocols. The test interface 230 may receive capture clock pulses 235 such as the capture clock pulses provided by the scan tester 125 shown in FIG. 1.

The power supply monitor 200 also includes alarm logic 240 that receives the information indicative of the number of stage transitions or ring oscillator revolutions of the ring oscillator 205, which are indicative of the voltage measured by the power supply monitor 200. The alarm logic 240 can compare the measured voltage (or the information indicative thereof) to a minimum or maximum voltage threshold 245. In some embodiments, the voltage threshold 245 is predetermined and may be stored in fuses, a register, or other memory location in the power supply monitor 200. For example, the voltage threshold 245 may be set to a value that corresponds to a voltage that would cause the processing device under test to run slowly enough (e.g., at a low enough frequency or high enough period) to cause a fault in response to a scan test. However, persons of ordinary skill in the art having benefit of the present disclosure should appreciate that the voltage threshold 245 may be set to other values that are determined based on other potential fault conditions. The alarm logic 240 may provide a fault signal (FAULT) in response to the comparison indicating that the measured voltage has drooped below the voltage threshold 245. For example, the alarm logic 240 may provide the fault signal via the test interface 230.

Figure 2B:
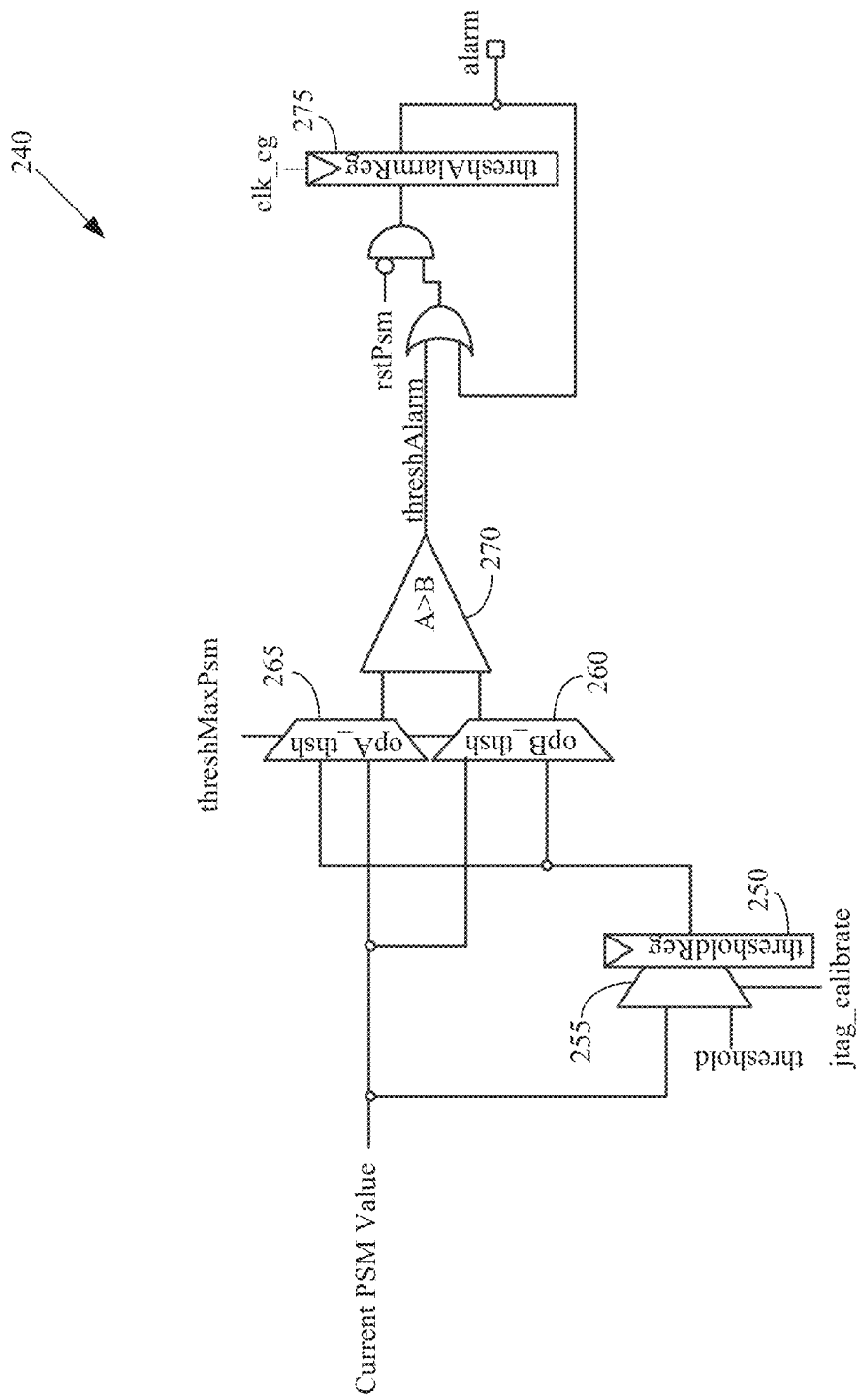
FIG. 2B is a block diagram of an alarm circuit that may be used in the PSM shown in FIG. 2A, according to some embodiments.

FIG. 2B is a block diagram of alarm logic 240, in accordance with some embodiments. A current value generated by a PSM, such as the power supply monitor 200 shown in FIG. 2A, is provided to the alarm logic 240. The current PSM value or another threshold value may be stored in a threshold register 250 using multiplexer 255, which receives a select signal such as a JTAG calibration signal. The alarm logic 240 may then determine whether the current PSM value is larger than or smaller than a particular threshold. For example, the current PSM value and a value in the threshold register 250 may be provided to multiplexers 260, 265 that receive a select signal (threshMaxPsm). Depending on the value of the select signal, comparator 270 may use the outputs of the multiplexers 260, 265 to determine whether the current PSM is larger than or smaller than the value in the threshold register 250. A threshold alarm may then be provided to a corresponding threshold alarm register 275 based on the results of the comparison and an alarm may be generated by the alarm logic 240. A reset signal (rstPsm) may also be provided to reset the threshold alarm register 275.

Referring back to FIG. 2A, some embodiments of the power supply monitor 200 may also receive information via the test interface 230 that can be used to configure the power supply monitor 200. For example, a test vector may be provided to the power supply monitor 200 via a scan chain in the test interface 230. The test vector may then be used to configure the power supply monitor 200 to measure the voltage provided by the power supply at a time or during a time interval indicated by information in the scan chain. For example, the test vector may be used to configure the power supply monitor 200 to measure the voltage provided by the power supply after a capture clock pulse provided by a scan tester such as the scan tester 125 shown in FIG. 1. Some embodiments of the power supply monitor 200 can be triggered to capture the state of the ring oscillator 205 at a predetermined time after the start of a scan test. For example, the power supply monitor 200 can be triggered using a digital counter that is synchronized to the system clock and is tuned based on the cycle time of the scan test so that the power supply monitor 200 captures an instantaneous voltage sample corresponding to the scan test after the digital counter counts down, e.g., from an initial value to zero. The power supply monitor 200 may also be configured to provide test results including information indicating whether the measured voltage was less than the voltage threshold 245 via the test interface 230 in response to another capture clock pulse so that the scan tester can read out the test results via the test interface 230.

Figure 3:
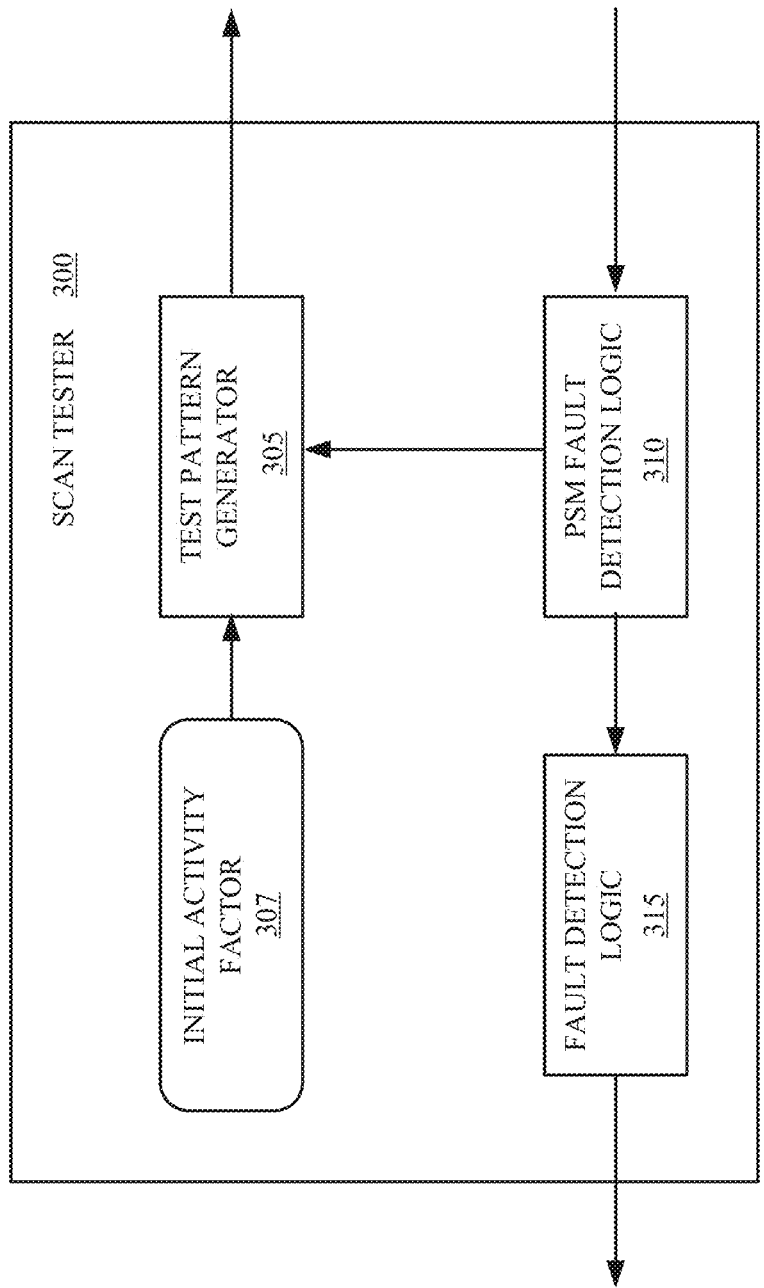
FIG. 3 is a block diagram of a scan tester such as the scan tester shown in FIG. 1, according to some embodiments.

FIG. 3 is a block diagram of a scan tester 300 such as the scan tester 125 shown in FIG. 1, according to some embodiments. The scan tester 300 may be implemented with a power supply on a probe card such as the probe card 120 shown in FIG. 1 or the scan tester 300 may be a standalone element. Some embodiments of the scan tester 300 include a test pattern generator 305 that can be used to generate test vectors including information that is used to configure portions of a processing device for a test such as an at-speed scan test. For example, the test pattern generator 305 may be a power-aware automatic test pattern generator (ATPG). The test vectors may be part of a scan set that is generated based on an initial activity factor 307. Some embodiments of the test pattern generator 305 can generate the scan set by restricting the overall toggle rate of gates in the device under test during the scan test to a maximum activity factor (AF) corresponding to an overall node switching activity rate indicated by the initial activity factor 307. The test pattern generator 305 may include testing logic that is implemented in software, firmware, or hardware.

The test pattern generator 305 can provide the test vectors to the device under test, e.g., by scanning the test vector into a scan chain associated with the device under test. The test pattern generator 305 (or other logic within the scan tester 300) may generate capture clock pulses that initiate testing of the device under test or trigger capture of the results of the test. For example, the test pattern generator 305 may write a test vector from the scan set into the device under test and then generate a capture clock pulse to launch a test of the device on the basis of the information in the test vector. The test pattern generator 305 may then generate another capture clock pulse to capture test results generated by the device under test. This process can be repeated for each test vector in the scan set. Some embodiments of the test pattern generator 305 may generate the first and second capture clock pulses at an interval determined by a maximum operating frequency (or minimum period) of the device under test.

Some embodiments of the scan tester 300 include PSM fault detection logic 310 that receives fault signals generated by power supply monitors in the device under test. For example, the PSM fault detection logic 310 may receive information read out of the scan chains in one or more PSMs in the device under test then use this information to detect fault signals that indicate that the voltage measured by one or more of the PSMs has drooped below a voltage threshold. This information may then be provided to fault detection logic 315 that is used to detect faults using information received from one or more circuit blocks in the device under test. The fault detection logic 315 may use the PSM fault signals to decide whether any detected faults are the results of design or fabrication deficiencies in one or more of the circuit blocks or a consequence of a voltage droop. For example, the fault detection logic 315 may invalidate or ignore fault signals generated by one or more circuit blocks if the PSM fault detection logic 315 provides a PSM fault signal that indicates that a large voltage droop may be responsible for the fault signals generated by the circuit blocks.

The PSM fault detection logic 310 may also provide the PSM fault signal to the test pattern generator 305, which may modify the test vectors provided to the test pattern generator 305 in response to PSM fault signals provided by the PSM fault detection logic 310. For example, if the PSM fault detection logic 310 detects one or more PSM fault signals in the test results, the test pattern generator 305 may modify one or more of the test vectors to generate a modified scan set. Some embodiments of the PSM fault detection logic 310 may use a statistical test to determine whether to accept the test results or reject the test results. For example, the PSM fault signals may be compared a target PSM alarm level that corresponds to a target voltage variance. Test vectors that produce PSM fault signals that exceed the target PSM alarm level may be removed from the scan set. The PSM fault detection logic 310 may also evaluate the fault coverage of the scan set. If the fault coverage is satisfactory, the PSM fault detection logic 310 may accept the results. Otherwise, the PSM fault detection logic 310 may provide a signal to the test pattern generator 305 that indicates that the test vectors in the scan set are to be modified and the scan test repeated.

The test pattern generator 305 can modify the test vectors in the scan set by reducing the activity factor (relative to the initial activity factor 307) used to generate the test vectors. Reducing the activity factor can reduce the maximum current peak during the scan test, which may reduce the voltage droop during the scan test. However, in order to cover the same fault universe with test vectors having a lower activity factor, the scan set generated by the test pattern generator 305 may include a larger number of test vectors for the same scan coverage level. Some embodiments of the test pattern generator may generate the modified test vectors based on predicted voltage droops for the modified test patterns. Examples of parameters that may indicate the predicted voltage droop for a modified test vector include the number or percentage of transistors or logic gates that switch states during a test of the circuit blocks in a processing device, the duration of the test interval, a sustained (DC) component of the voltage, a variable (AC) component of the voltage, and the like. The process of modifying test vectors in response to PSM fault signals, retesting the device under test, and evaluating the results may be repeated until the fault coverage is satisfactory.

Figure 4:
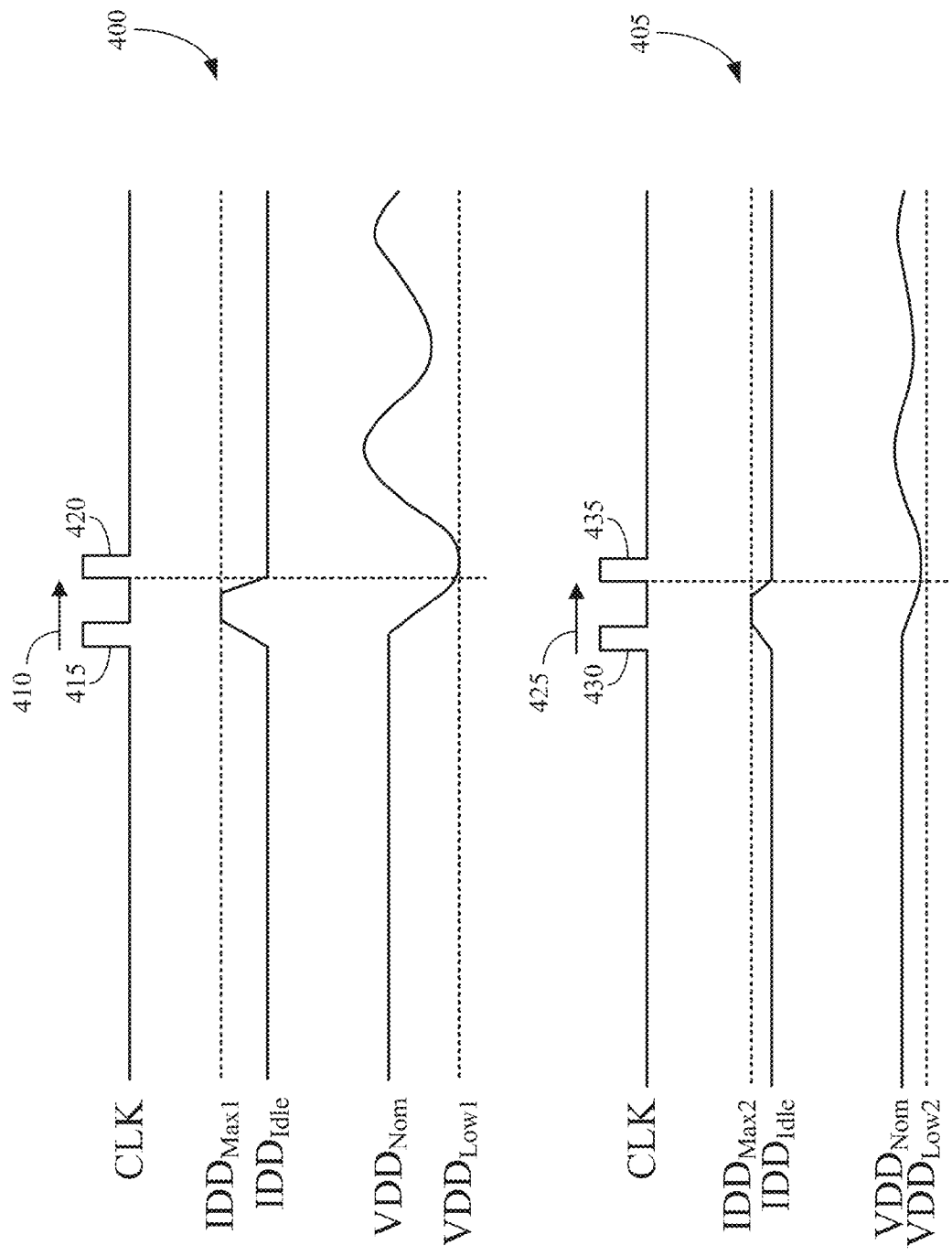
FIG. 4 plots a clock signal, a current draw, and a voltage produced by different test patterns such as the test patterns generated by the test pattern generator shown in FIG. 3, according to some embodiments.

FIG. 4 plots a clock signal (CLK), a current draw (IDD), and a voltage (VDD) produced by different test vectors 400, 405 such as the test vectors generated by the test pattern generator 305 shown in FIG. 3, according to some embodiments. The horizontal axis indicates time and increases from left to right. The test interval for the first test vector 400 is indicated by a cycle time 410 from a first capture clock pulse 415 provided by a scan tester to a second capture clock pulse 420 provided by the scan tester. Prior to beginning the test interval, e.g., while a test vector is being written into scan chains in preparation for the test, the voltage supplied to circuit blocks in the device under test is approximately equal to the nominal voltage ($VDD_{Nom}$) and the current drawn by the circuit blocks is equal to the idle current ($IDD_{Idle}$) Testing is launched following the first capture clock pulse 415 and circuit blocks begin to draw a large current that reaches or exceeds a maximum current level ($IDD_{Max1}$). The large current draw results in a voltage droop to the voltage ($VDD_{Low1}$), which may be lower than a voltage threshold for triggering a fault in a power supply monitor. A power supply monitor may therefore provide a fault signal indicating that the voltage droop may be responsible for other faults produced by the device under test.

As discussed herein, a power-aware ATPG may generate new test vectors that generate smaller current draws and therefore result in a smaller voltage droops. For example, the power-aware ATPG may generate a scan set using a lower activity factor. Thus, the circuit blocks in the device under test may be tested without causing a voltage droop that is large enough to produce fault conditions in otherwise correctly designed and fabricated processing device.

The modified scan set of test vectors may then be used for scan testing during the cycle time 425 from a first capture clock pulse 430 to a second capture clock pulse 435. Prior to beginning the test interval, e.g., while a modified test vector is being written into scan chains in preparation for the test, the voltage supplied to circuit blocks in the device under test is approximately equal to the nominal voltage ($VDD_{Nom}$) and the current drawn by the circuit blocks is equal to the idle current ($IDD_{Idle}$) Testing is launched following the first capture clock pulse 430 and circuit blocks begin to draw a current ($IDD_{Max2}$) that is lower than the previous maximum current level ($IDD_{Max1}$). The current draw results in a voltage droop to a voltage ($VDD_{Low2}$) that is larger than the voltage ($VDD_{Low1}$). This voltage may not be small enough to trigger a fault in the power supply monitor.

Figure 5:
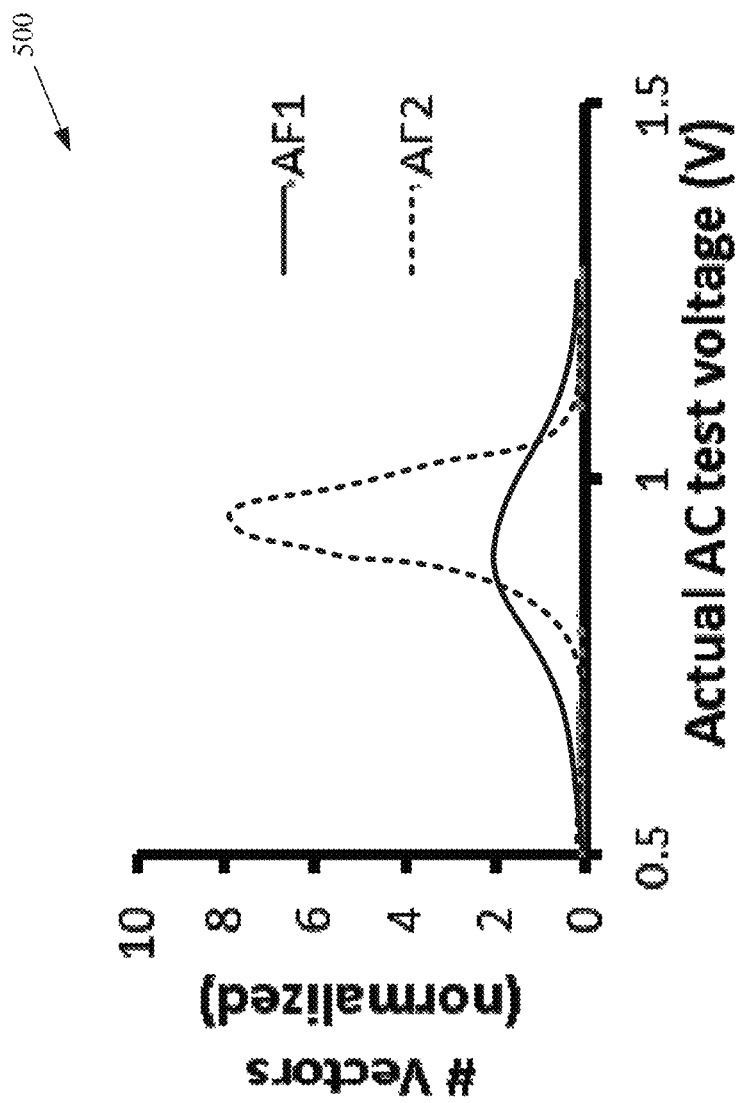
FIG. 5 is a plot of the voltage distribution measured for two sets of power aware ATPG scan sets that have activity factors AF1 and AF2, respectively, where AF1>AF2, according to some embodiments.

FIG. 5 is a plot 500 of the voltage distribution measured for two sets of power aware ATPG scan sets that have activity factors AF1 and AF2, respectively, where AF1>AF2, according to some embodiments. The vertical axis indicates the number of test vectors corresponding to a particular voltage, normalized to a nominal value. The horizontal axis indicates a measured test voltage normalized to the nominal tester voltage. The distribution for AF2 is tighter and the mean voltage is closer to the nominal tester voltage. However, the scan set for AF2 includes twice as many test vectors, which may result in increased time on the tester and increased manufacturing costs. A set of test vectors with a tighter voltage distribution should have improved correlation to actual functionally stimulated paths since the path logic is tested at a more precisely controlled voltage. Thus, the results of tests performed using the scan set of test vectors having the activity factor AF2 should have improved correlation to actual functionality than the scan set of test vectors having the activity factor AF1.

Figure 6:
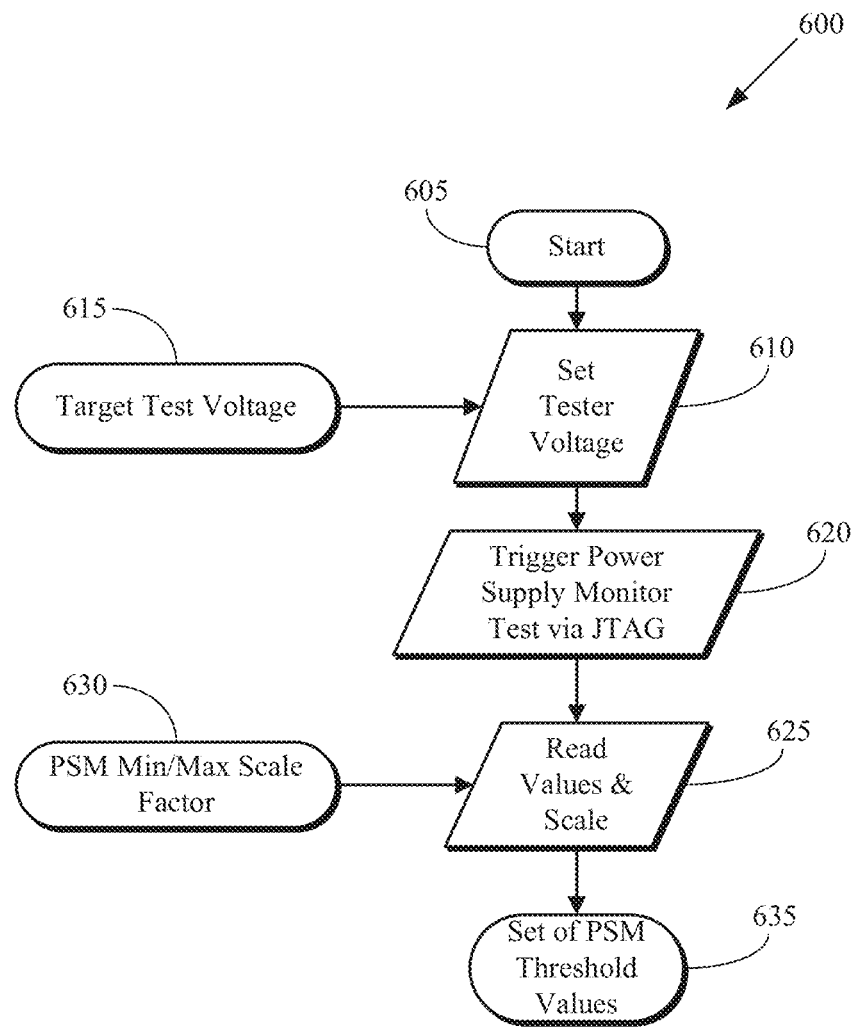
FIG. 6 is a flow diagram of a method for calibrating threshold values used to trigger faults in a power supply monitor, according to some embodiments.

FIG. 6 is a flow diagram of a method 600 for calibrating threshold values used to trigger faults in a power supply monitor, according to some embodiments. The method 600 starts at block 605. At block 610, a scan tester voltage is set using a target test voltage 615. At block 620, the scan tester triggers a power supply monitor test by loading the appropriate scan chain via a JTAG interface in the power supply monitor. At block 625, results are read out from the power supply monitor via the JTAG interface and threshold values for triggering power supply monitor faults can be scaled based upon a power supply monitor minimum/maximum scale factor 630. The scaled threshold values may then be stored (at block 635) as the PSM threshold values for subsequent tests.

Some embodiments of the method 600 may be performed for all PSM modules in a processing device and the resulting alarm values may be scaled by a scaling factor (Sf) corresponding to a target variance of the voltage distribution such as the variance of the voltage distribution shown in FIG. 5. Calibrating the PSM modules according to the method 600 may normalize out local and global process variations in the PSM measurement that can degrade the precision of the voltage measurements. Some embodiments of the method 600 may be run on the processing device prior to optimizing the test vectors in the scan set to ensure accurate readings. PSM readings may not be required for scan test operations after the scan set of test vectors has been optimized and so in some embodiments the method 600 may only be used for characterization of the scan vector tests. Some embodiments may trigger PSM faults using a "delta mode" configuration that employs a double sampling approach. In the double sampling approach, the PSM is triggered twice, once prior to the scan test to capture the nominal supply voltage without droop and again at a later time to capture the droop during the scan test. The difference between the two values is then compared to the PSM threshold and a fault is asserted when the difference is exceeded. The delta mode would use a variation of method 600 to calibrate the delta mode threshold values.

Figure 7:
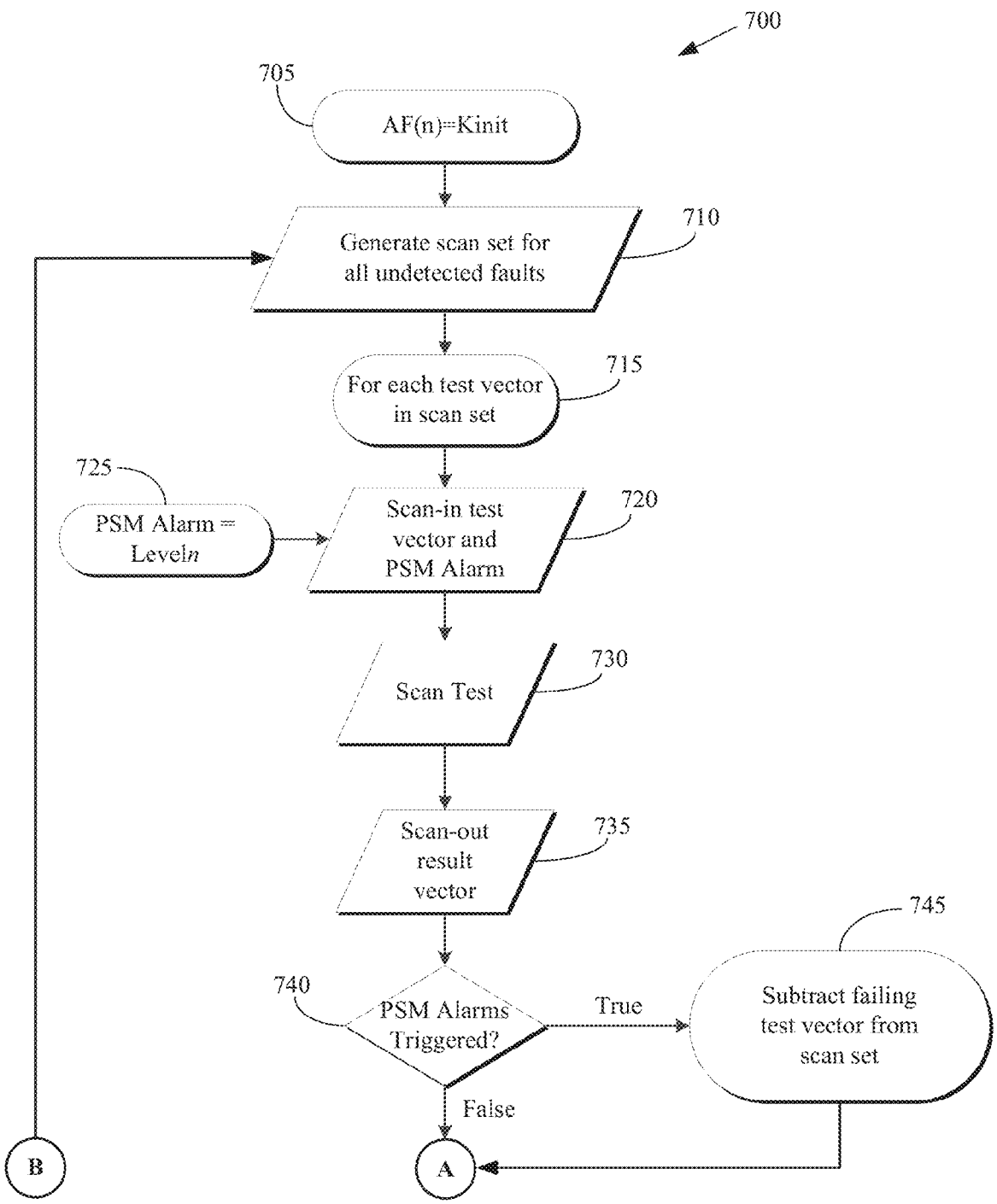
FIG. 7 and FIG. 8 are a flow diagram of a method of scan testing a processing device, according to some embodiments.
Figure 8:
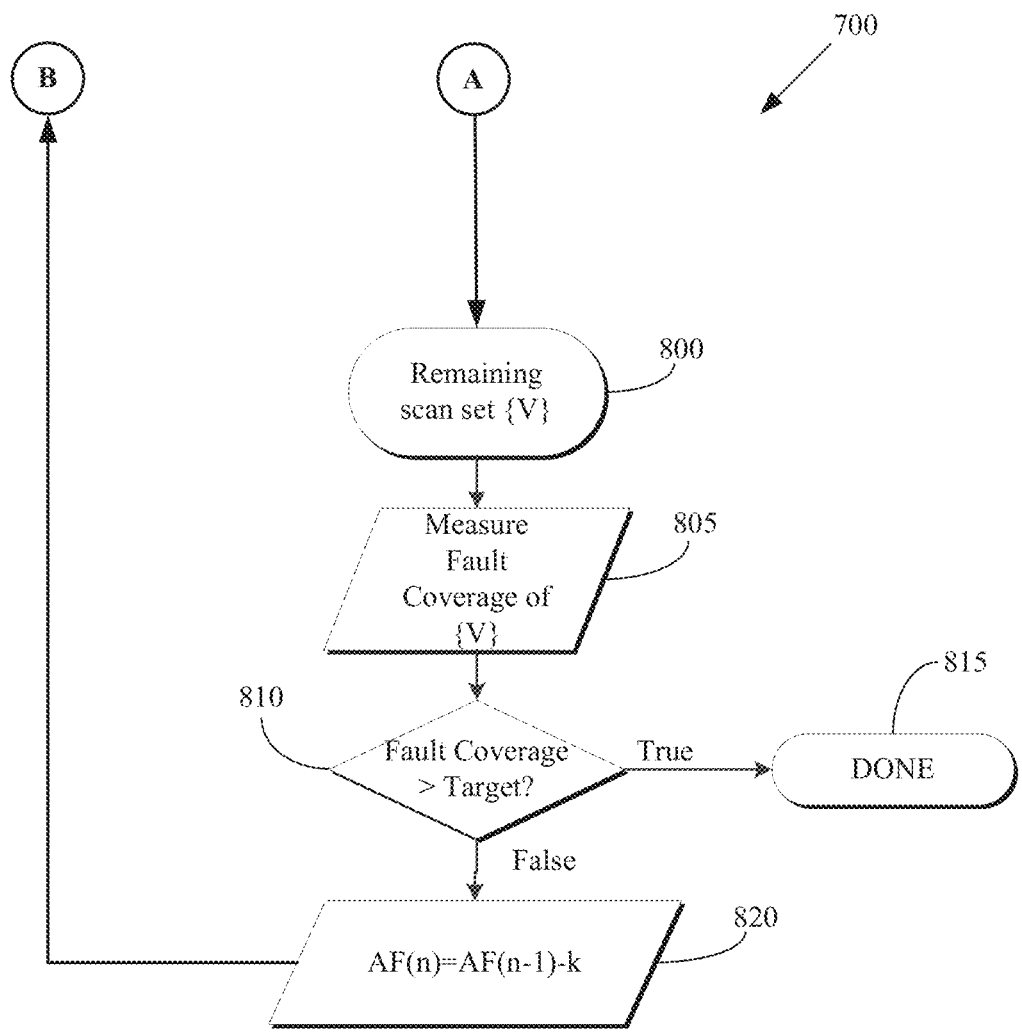

FIG. 7 and FIG. 8 are a flow diagram of a method 700 of scan testing a processing device with FIG. 7 illustrating blocks 705-745 and FIG. 8 illustrating blocks 800-820, according to some embodiments. Some embodiments of the method 700 may be implemented in a scan tester such as the scan tester 300 shown in FIG. 3. Activity factors for the n scan sets are initialized to the value Kinit at block 705. At block 710, an automatic test pattern generator (ATPG) uses the initialized activity factors to generate a scan set of test vectors for undetected faults associated with the processing device under test. At block 715, individual test vectors in the scan set are tested against a target PSM alarm level corresponding to a target voltage variance. The test of the individual test vectors include scanning in (at block 720) the test vector and PSM threshold values corresponding to alarm levels 725.

The scan test is performed at block 730, e.g., using one or more capture clock pulses, and the results of the scan test are scanned out at block 735. At block 740, the scan tester determines whether one or more PSM alarms have been triggered, as indicated in the scanned out results. If this condition is true, test vectors associated with the PSM alarms can be subtracted from the scan set at block 745. The method 700 may then proceed to block 800 in FIG. 8 on the basis of the remaining scan set of test vectors {V}.

At block 805, the scan tester measures the fault coverage of the remaining scan set of test vectors {V}. At block 810, the scan tester determines whether the fault coverage of the remaining scan set of test vectors exceeds a predetermined target value of the fault coverage. If this condition is true, the method 700 ends at block 815. If this condition is false, the activity factor is modified by reducing the activity factor at block 820. Some embodiments may reduce the activity factors for each of the scan sets by a constant value k. Other embodiments may reduce the activity factors of the different scan sets by different values. The reduced value of the activity factor corresponds to a lower $IDD_{Max}$ current, as discussed herein. The method 700 then returns to block 710 in FIG. 7. The method 700 may be iterated until the fault coverage meets the predetermined target value.

Figure 9:
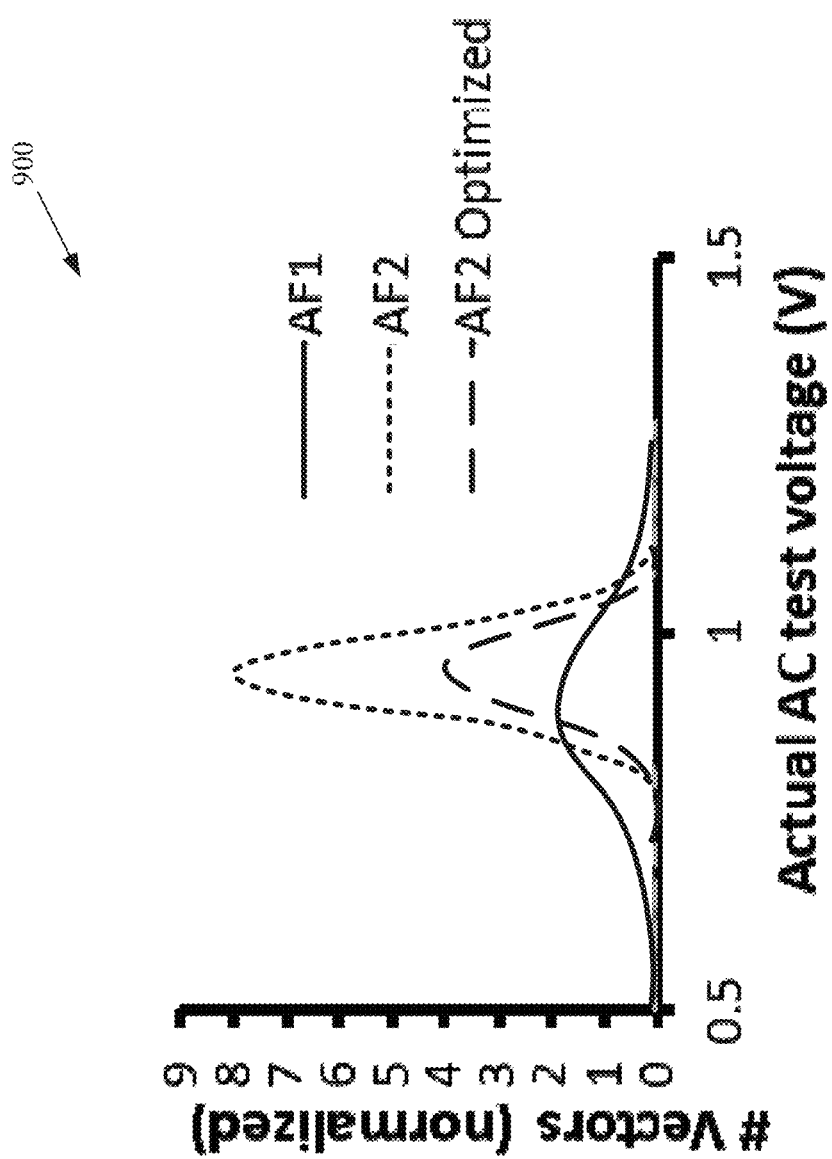
FIG. 9 is a plot of voltage distributions for a first activity factor AF1, a second activity factor AF2, and an optimized scan set of test vectors for the second activity factor AF2-Optimized, according to some embodiments.

FIG. 9 is a plot 900 of voltage distributions for a first activity factor AF1, a second activity factor AF2, and an optimized scan set of test vectors for the second activity factor AF2-Optimized, according to some embodiments. The vertical axis indicates the number of test vectors corresponding to a particular voltage, normalized to a nominal value. The horizontal axis indicates a measured test voltage normalized to the nominal tester voltage. The voltage distribution shown in FIG. 9 may be produced by some embodiments of the method 700 shown in FIGS. 7 and 8. As shown in FIG. 9, embodiments of the optimization process may remove some of the test vectors from the tails of the distribution of scan sets generated for the first activity factor AF1 when the current draw or voltage droop associated with the removed test vectors exceeds a threshold. Faults associated with the removed test vectors may then be tested using test vectors formed using the second activity factor AF2 or AF2-Optimized. The distribution of scan sets therefore becomes more concentrated as some of the test vectors formed using the first activity factor AF1 are replaced with test vectors formed using the second activity factor AF2 or AF2-Optimized. In some embodiments, the optimized scan set of test vectors for the activity factor AF2 may include a smaller total number of test vectors than the scan set of test vectors generated with activity factor AF1, where AF1>AF2.

Figure 10:
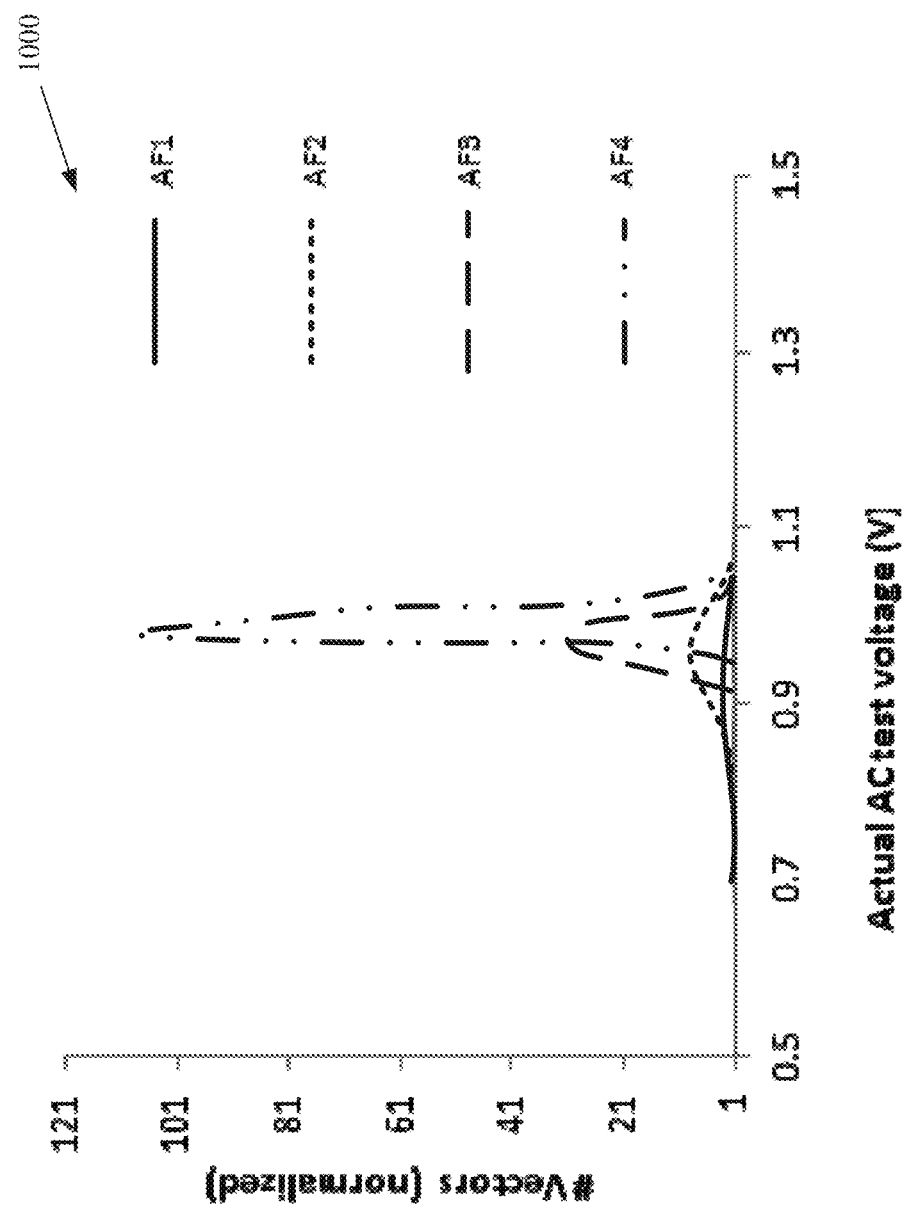
FIG. 10 is a plot of voltage distributions for four different activity factors AF1-AF4, according to some embodiments.

FIG. 10 is a plot 1000 of voltage distributions for four different activity factors AF1-AF4, according to some embodiments. The vertical axis indicates the number of test vectors corresponding to a particular voltage, normalized to a nominal value. The horizontal axis indicates a measured test voltage normalized to the nominal tester voltage. Some embodiments of scan tester such as the scan tester 300 may implement a method that generates M sets of ATPG scan sets with activity factor levels that vary, e.g. from AF1 to AF4. Each scan set of ATPG test vectors may then be evaluated against a distribution of PSM alarm settings and the set with the tightest distribution can be chosen as the optimal set.

In some embodiments, the apparatus and techniques described above are implemented in a system comprising one or more integrated circuit (IC) devices (also referred to as integrated circuit packages or microchips), such as the processor cores described above with reference to FIGS. 1-10. Electronic design automation (EDA) and computer aided design (CAD) software tools may be used in the design and fabrication of these IC devices. These design tools typically are represented as one or more software programs. The one or more software programs comprise code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Figure 11:
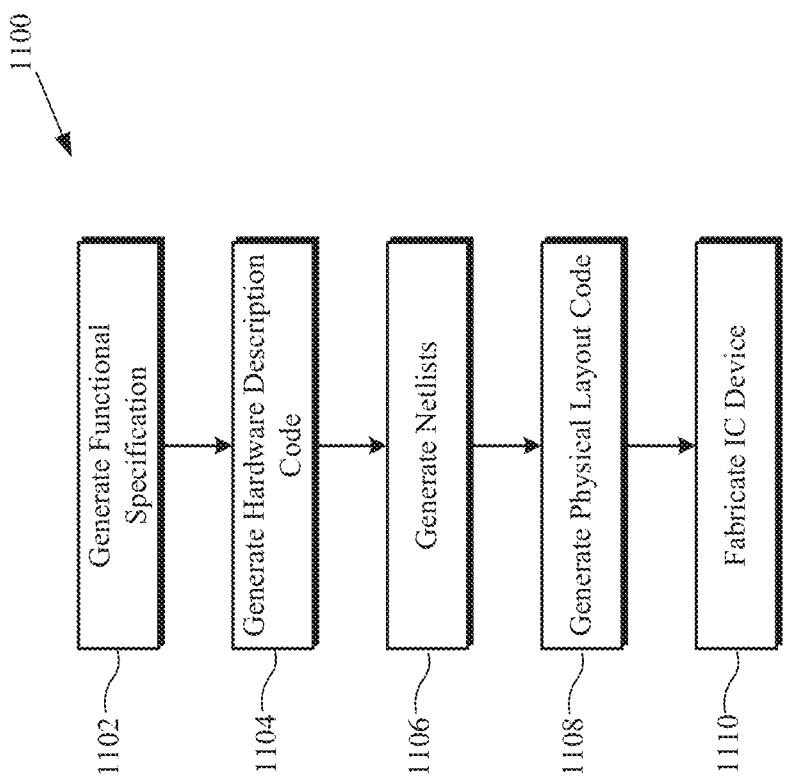
FIG. 11 is a flow diagram illustrating a method for the design and fabrication of an integrated circuit (IC) device implementing one or more aspects, according to some embodiments.

FIG. 11 is a flow diagram illustrating an example method 1100 for the design and fabrication of an IC device implementing one or more aspects, according to some embodiments. As noted above, the code generated for each of the following processes is stored or otherwise embodied in computer readable storage media for access and use by the corresponding design tool or fabrication tool.

At block 1102 a functional specification for the IC device is generated. The functional specification (often referred to as a micro architecture specification (MAS)) may be represented by any of a variety of programming languages or modeling languages, including C, C++, SystemC, Simulink, or MATLAB.

At block 1104, the functional specification is used to generate hardware description code representative of the hardware of the IC device. Some embodiments of the hardware description code are represented using at least one Hardware Description Language (HDL), which comprises any of a variety of computer languages, specification languages, or modeling languages for the formal description and design of the circuits of the IC device. The generated HDL code typically represents the operation of the circuits of the IC device, the design and organization of the circuits, and tests to verify correct operation of the IC device through simulation. Examples of HDL include Analog HDL (AHDL), Verilog HDL, SystemVerilog HDL, and VHDL. For IC devices implementing synchronized digital circuits, the hardware descriptor code may include register transfer level (RTL) code to provide an abstract representation of the operations of the synchronous digital circuits. For other types of circuitry, the hardware descriptor code may include behavior-level code to provide an abstract representation of the circuitry's operation. The HDL model represented by the hardware description code typically is subjected to one or more rounds of simulation and debugging to pass design verification.

After verifying the design represented by the hardware description code, at block 1106 a synthesis tool is used to synthesize the hardware description code to generate code representing or defining an initial physical implementation of the circuitry of the IC device. In some embodiments, the synthesis tool generates one or more netlists comprising circuit device instances (e.g., gates, transistors, resistors, capacitors, inductors, diodes, etc.) and the nets, or connections, between the circuit device instances. Alternatively, all or a portion of a netlist can be generated manually without the use of a synthesis tool. As with the hardware description code, the netlists may be subjected to one or more test and verification processes before a final set of one or more netlists is generated.

Alternatively, a schematic editor tool can be used to draft a schematic of circuitry of the IC device and a schematic capture tool then may be used to capture the resulting circuit diagram and to generate one or more netlists (stored on a computer readable medium) representing the components and connectivity of the circuit diagram. The captured circuit diagram may then be subjected to one or more rounds of simulation for testing and verification.

At block 1108, one or more EDA tools use the netlists produced at block 1106 to generate code representing the physical layout of the circuitry of the IC device. This process can include, for example, a placement tool using the netlists to determine or fix the location of each element of the circuitry of the IC device. Further, a routing tool builds on the placement process to add and route the wires needed to connect the circuit elements in accordance with the netlist(s). The resulting code represents a three-dimensional model of the IC device. The code may be represented in a database file format, such as, for example, the Graphic Database System II (GDSII) format. Data in this format typically represents geometric shapes, text labels, and other information about the circuit layout in hierarchical form.

At block 1110, the physical layout code (e.g., GDSII code) is provided to a manufacturing facility, which uses the physical layout code to configure or otherwise adapt fabrication tools of the manufacturing facility (e.g., through mask works) to fabricate the IC device. That is, the physical layout code may be programmed into one or more computer systems, which may then control, in whole or part, the operation of the tools of the manufacturing facility or the manufacturing operations performed therein.

Portions of the disclosed subject matter and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the disclosed subject matter are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The disclosed subject matter is not limited by these aspects of any given implementation.

Furthermore, the methods disclosed herein may be governed by instructions that are stored in a non-transitory computer readable storage medium and that are executed by at least one processor of a computer system. Each of the operations of the methods may correspond to instructions stored in a non-transitory computer memory or computer readable storage medium. In various embodiments, the non-transitory computer readable storage medium includes a magnetic or optical disk storage device, solid state storage devices such as Flash memory, or other non-volatile memory device or devices. The computer readable instructions stored on the non-transitory computer readable storage medium may be in source code, assembly language code, object code, or other instruction format that is interpreted and/or executable by one or more processors.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A power supply monitor, comprising:
    a measurement circuit to measure a voltage provided to the power supply monitor;
    a comparator to compare the voltage to a predetermined voltage threshold;
    an interface to provide, during a scan test of a processing device including the power supply monitor, a fault signal in response to the voltage being below the voltage threshold; and
    a test interface for receiving a test pattern and providing test results in response to the test pattern, wherein the test pattern is used to configure the power supply monitor to measure the voltage after receiving a capture clock pulse generated by a test circuit.

2. The power supply monitor of claim 1, wherein the predetermined voltage threshold corresponds to a reduced speed of at least one circuit block that produces a fault in response to a test pattern provided to said at least one circuit block.

3. The power supply monitor of claim 1, comprising a test interface for receiving a test pattern and providing test results in response to the test pattern, wherein the test pattern is used to configure the power supply monitor to measure the voltage after receiving a capture clock pulse generated by a test circuit.

4. A power supply monitor, comprising:
    a measurement circuit to measure a voltage provided to the power supply monitor;
    a comparator to compare the voltage to a predetermined voltage threshold; and
    an interface to provide, during a scan test of a processing device including the power supply monitor, a fault signal in response to the voltage being below the voltage threshold, wherein the measurement circuit comprises a ring oscillator and at least one counter to count a number of stage transitions or ring oscillator revolutions during a measurement period, the number of stage transitions or ring oscillator revolutions being indicative of the voltage provided to the power supply monitor.

5. A method, comprising:
    providing a first test vector to at least one scan chain of at least one power supply monitor associated with at least one circuit block in a processing device; and
    capturing a first result generated by said at least one power supply monitor based on the first test vector scanned into the at least one scan chain, the first result indicating whether a voltage provided to said at least one circuit block is below a predetermined voltage threshold.

6. The method of claim 5, comprising measuring the voltage in response to said at least one power supply monitor receiving a first capture clock pulse after the first test vector is scanned into the at least one scan chain, and wherein capturing the first result comprises capturing the first result in response to a second capture clock pulse.

7. The method of claim 5, comprising providing the first test vector to a plurality of scan chains associated with a plurality of circuit blocks that comprise said at least one circuit block and a corresponding plurality of power supply monitors that comprise said at least one power supply monitor.

8. A method, comprising:
    providing a first test vector to a plurality of power supply monitors associated with a plurality of circuit blocks in a processing device;
    capturing a first result generated by the power supply monitors in response to the first test vector; and
    generating at least one second test vector in response to the first result indicating that at least one voltage provided to at least one of the plurality of circuit blocks is below a predetermined voltage threshold, wherein said at least one second test vector is generated based upon a lower activity factor than the first test vector.

9. The method of claim 8, comprising providing said at least one second test vector to the plurality of circuit blocks, wherein the plurality of circuit blocks draws less current during a test using said at least one second test vector than a current drawn during a test of the plurality of circuit blocks using the first test vector.

10. The method of claim 8, wherein generating said at least one second test vector comprises generating said at least one second test vector when a fault coverage corresponding to the first test vector is less than a target fault coverage.

11. The method of claim 8, comprising removing the first test vector from a scan set of test vectors in response to the first result indicating that said at least one voltage provided to said at least one of the plurality of circuit blocks is below the voltage threshold.

12. An apparatus, comprising:
test logic for providing a first test vector to at least one scan chain of at least one power supply monitor associated with at least one circuit block in a processing device and for capturing at least one first result generated by said at least one power supply monitor based on the first test vector scanned into the at least one scan chain, said at least one first result indicating whether a voltage provided to said at least one circuit block is below a predetermined voltage threshold.

13. The apparatus of claim 12, comprising a power supply for coupling to said at least one circuit block in the processing device and generating the voltage provided to said at least one circuit block.

14. The apparatus of claim 12, wherein the first test vector configures said at least one power supply monitor to measure the voltage after receiving a first capture clock pulse generated by the test logic after the first vector is scanned into the at least one scan chain.

15. The apparatus of claim 14, wherein the test logic captures said at least one first result generated by said at least one power supply monitor in response to a second capture clock pulse generated by the test logic.

16. The apparatus of claim 12, wherein said at least one circuit block comprises a plurality of circuit blocks and wherein a plurality of power supply monitors are associated with the plurality of circuit blocks, and wherein the test logic provides the first test vector to the plurality of circuit blocks and the plurality of power supply monitors.

17. An apparatus, comprising:
test logic for providing a first test vector to a plurality of power supply monitors associated with a plurality of circuit blocks in a processing device and for capturing a first result generated by the plurality of power supply monitors based on the first test vector; and
a test pattern generator for generating at least one second test vector in response to the first result indicating that at least one voltage provided to at least one of the plurality of circuit blocks is below a predetermined voltage threshold, wherein said at least one second test vector is generated based upon a lower activity factor than the first test vector.

18. The apparatus of claim 17, wherein the test logic provides said at least one second test vector to the plurality of circuit blocks, wherein the plurality of circuit blocks draws less current during a test using said at least one second test vector than a current drawn during a test of the plurality of circuit blocks using the first test vector.

19. The apparatus of claim 17, wherein the test pattern generator generates said at least one second test vector comprises generating said at least one second test vector when a fault coverage corresponding to the first test vector is less than a target fault coverage.

20. The apparatus of claim 12, wherein the test logic removes the first test vector from a scan set of test vectors in response to the first result indicating that said at least one voltage provided to said at least circuit block is below the voltage threshold.

* * * * *